US009402041B2

(12) United States Patent
Numata

(10) Patent No.: US 9,402,041 B2
(45) Date of Patent: Jul. 26, 2016

(54) SOLID-STATE IMAGE SENSOR AND IMAGING APPARATUS USING SAME

(71) Applicant: CANON KABUSHIKI KAISHA, Tokyo (JP)

(72) Inventor: Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 32 days.

(21) Appl. No.: 14/327,937

(22) Filed: Jul. 10, 2014

(65) Prior Publication Data

US 2015/0015752 A1    Jan. 15, 2015

(30) Foreign Application Priority Data

Jul. 11, 2013   (JP) ................................. 2013-145559
Sep. 4, 2013    (JP) ................................. 2013-183017
May 8, 2014     (JP) ................................. 2014-097073
May 8, 2014     (JP) ................................. 2014-097074

(51) Int. Cl.
*H01L 27/146*    (2006.01)
*H04N 5/335*     (2011.01)
*H04N 5/369*     (2011.01)

(52) U.S. Cl.
CPC ........ *H04N 5/3696* (2013.01); *H01L 27/14601* (2013.01); *H01L 27/14627* (2013.01); *H04N 5/335* (2013.01)

(58) Field of Classification Search
CPC ................. H04N 5/335; H04N 5/3745; H01L 27/14601; H01L 27/14627
See application file for complete search history.

(56) References Cited

U.S. PATENT DOCUMENTS

| 7,655,892 | B2 | 2/2010 | Oda et al. |
| 8,243,186 | B2 | 8/2012 | Yamazaki |
| 9,160,942 | B2 * | 10/2015 | Numata ............ H01L 27/14627 |
| 2002/0079491 | A1 * | 6/2002 | Raynor ............ H01L 27/14627 257/59 |
| 2010/0059844 | A1 * | 3/2010 | Tanaka ................. G02B 3/0056 257/432 |
| 2011/0273581 | A1 * | 11/2011 | Fujii ........................ G02B 7/34 348/222.1 |
| 2012/0119068 | A1 | 5/2012 | Numata |
| 2013/0107086 | A1 | 5/2013 | Nagano |

FOREIGN PATENT DOCUMENTS

| JP | 2005-286565 A | 10/2005 |
| JP | 2007-158109 A | 6/2007 |
| JP | 2007-158692 A | 6/2007 |
| JP | 2007-184840 A | 7/2007 |
| JP | 2010-182765 A | 8/2010 |
| JP | 485136 B | 12/2011 |
| JP | 4835136 A | 12/2011 |
| JP | 2012-037777 A | 2/2012 |
| JP | 2012-049994 A | 3/2012 |

* cited by examiner

*Primary Examiner* — Timothy J Henn
(74) *Attorney, Agent, or Firm* — Fitzpatrick, Cella, Harper & Scinto

(57) ABSTRACT

A solid-state image sensor provided with a plurality of pixels which photo-electrically convert an object image formed by an imaging optical system, wherein at least a portion of the plurality of pixels are ranging pixels in which a first photo-electric conversion unit, a barrier region and a second photo-electric conversion unit are provided in alignment in a first direction in this sequence; in the peripheral regions where are distanced from a straight line perpendicular to the first direction and passing through the center of the solid-state image sensor, for more than half of the ranging pixels, the barrier region is situated eccentrically in a direction parallel to the first direction.

15 Claims, 11 Drawing Sheets

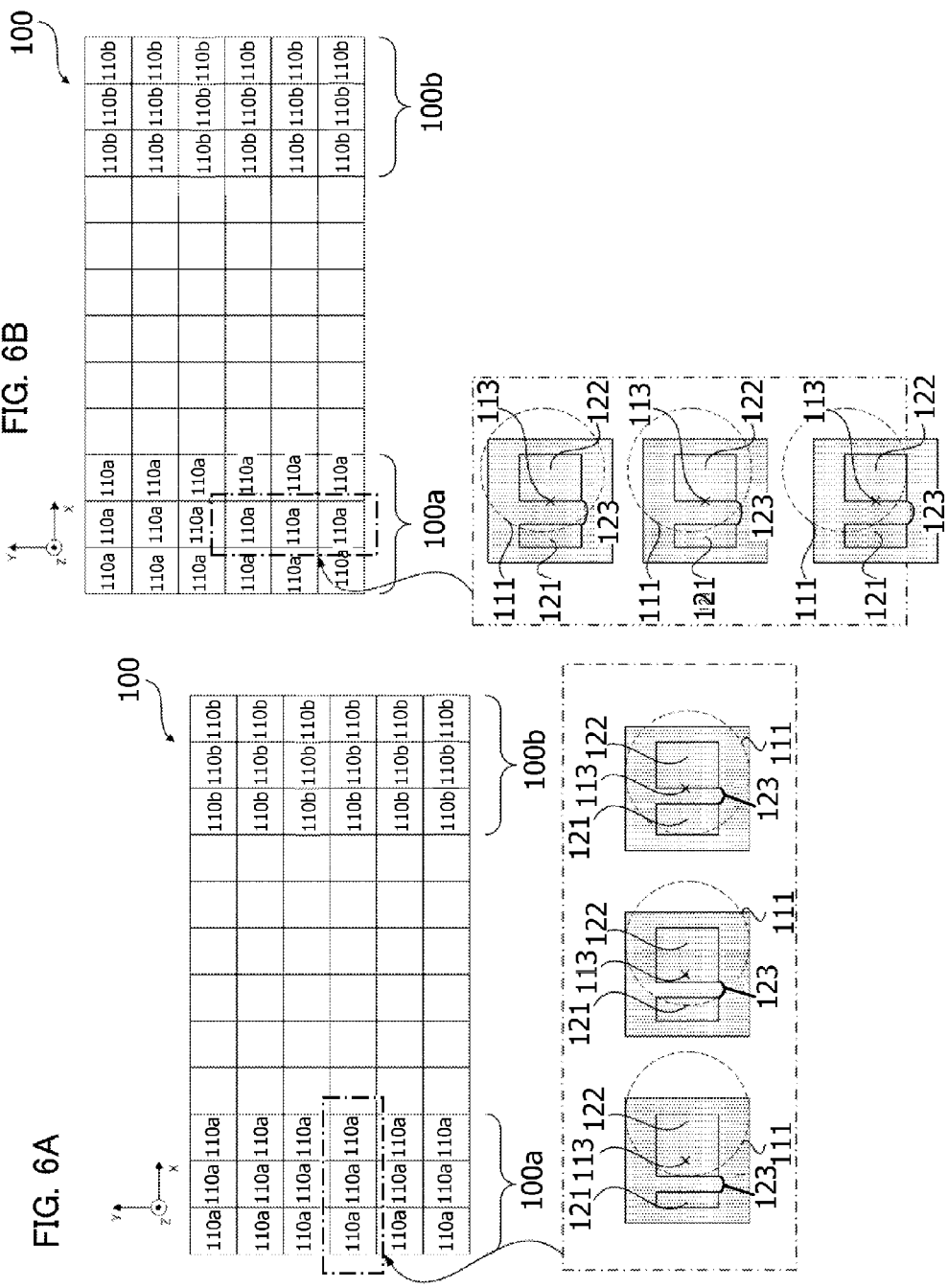

SOLID-STATE IMAGE SENSOR AND IMAGING APPARATUS USING SAME

BACKGROUND OF THE INVENTION

1. Field of the Invention

The present invention relates to a solid-state image sensor, and more particularly, to a solid-state image sensor used in a digital camera or video camera.

2. Description of the Related Art

In recent years, from the viewpoint of making digital cameras more compact in size, a solid-state image sensor which corresponds to a camera lens having a short back focus has been demanded. Furthermore, from the viewpoint of expanding the dynamic range of a digital camera, there have been demands to use a solid-state image sensor having a large size in compact digital cameras. In a digital camera which is subject to requirements of this kind, since the light beam is input at a widely inclined angle to the pixels in the peripheral region of the solid-state image sensor, the sensitivity of the pixels in the peripheral region is reduced.

In view of this problem, Japanese Patent Application Publication No. 2010-182765 discloses a solid-state image sensor in which microlenses provided on pixel surfaces are situated eccentrically with respect to the central direction of the solid-state image sensor, whereby it is possible to detect, with good accuracy, a light beam input at an inclined angle with respect to the pixels.

On the other hand, focal point detection technology is also available in digital cameras. Japanese Patent No. 04835136 discloses, in respect to this technology, a solid-state image sensor which has a composition for focal point detection by a phase differential method in a portion of the pixels of a solid-state image sensor. A phase differential method is a method which compares the images of light passing through different regions of the pupil of an imaging optical system, and detects a depth by triangulation based on the stereo images.

SUMMARY OF THE INVENTION

Even in a solid-state image sensor having a depth measurement function such as that disclosed in Japanese Patent No. 04835136, a problem occurs in that the pixel sensitivity declines in the peripheral portion if the back focus is shortened or the dynamic range is expanded. In order to respond to this problem, it is conceivable to apply a method in which the microlenses are arranged eccentrically toward the center direction of the solid-state image sensor, as disclosed in Japanese Patent Application Publication No. 2010-182765.

However, if the method of eccentric arrangement of the microlenses disclosed in Japanese Patent Application Publication No. 2010-182765 is simply combined with the ranging pixels disclosed in Japanese Patent No. 04835136, then problems such as the following occur. In general, the exit pupil position of the focusing optical system changes with the zoom and focus conditions of the camera lens. Furthermore, in the case of a solid-state image sensor used in a camera compatible with exchangeable lenses, the exit pupil position of the imaging optical system changes with the lens used. In other words, the angle of the main light beam which is incident on the ranging pixel varies with the lens used and the zoom and focus conditions.

Consequently, a trade-off arises in that if the amount of eccentricity of the microlenses is small, then the depth accuracy with a near exit pupil position of the imaging optical system becomes poor, and if the amount of eccentricity of the microlenses becomes large, then the depth accuracy with a far exit pupil position of the imaging optical system becomes poor.

It is an object of the present invention to provide a solid-state image sensor capable of performing highly accurate depth measurement (ranging), irrespective of the lens used and the zoom and focus conditions.

The first aspect of the present invention is a solid-state image sensor provided with a plurality of pixels which photoelectrically convert an object image formed by an imaging optical system, wherein at least a portion of the plurality of pixels are ranging pixels in which a first photoelectric conversion unit, a barrier region and a second photoelectric conversion unit are provided in alignment in a first direction in this sequence; when the region of the solid-state image sensor is divided by a straight line perpendicular to the first direction and passing through the center of the solid-state image sensor, into a first region which is positioned in a negative direction of the first direction from a straight line perpendicular to the first direction, and a second region which is positioned in a positive direction of the first direction from a straight line perpendicular to the first direction; more than half of the ranging pixels in a portion of the first region which is distanced by at least a prescribed distance from the straight line perpendicular to the first direction and passing through the center of the solid-state image sensor are first ranging pixels in which the center of a barrier region is situated eccentrically in the negative direction of the first direction with respect to the center of the ranging pixel; and more than half of the ranging pixels in a portion of the second region which is distanced by at least the prescribed distance from the straight line perpendicular to the first direction and passing through the center of the solid-state image sensor are second ranging pixels in which the center of a barrier region is situated eccentrically in the positive direction of the first direction with respect to the center of the ranging pixel.

According to the present invention, it is possible to carry out highly accurate depth measurement, even in a peripheral portion of a solid-state image sensor, irrespective of the lens used and the zoom and focus conditions.

Further features of the present invention will become apparent from the following description of exemplary embodiments with reference to the attached drawings.

BRIEF DESCRIPTION OF THE DRAWINGS

FIGS. 6A and 6B are diagrams showing modification examples of ranging pixels relating to the first embodiment;

DESCRIPTION OF THE EMBODIMENTS

Figure 1:
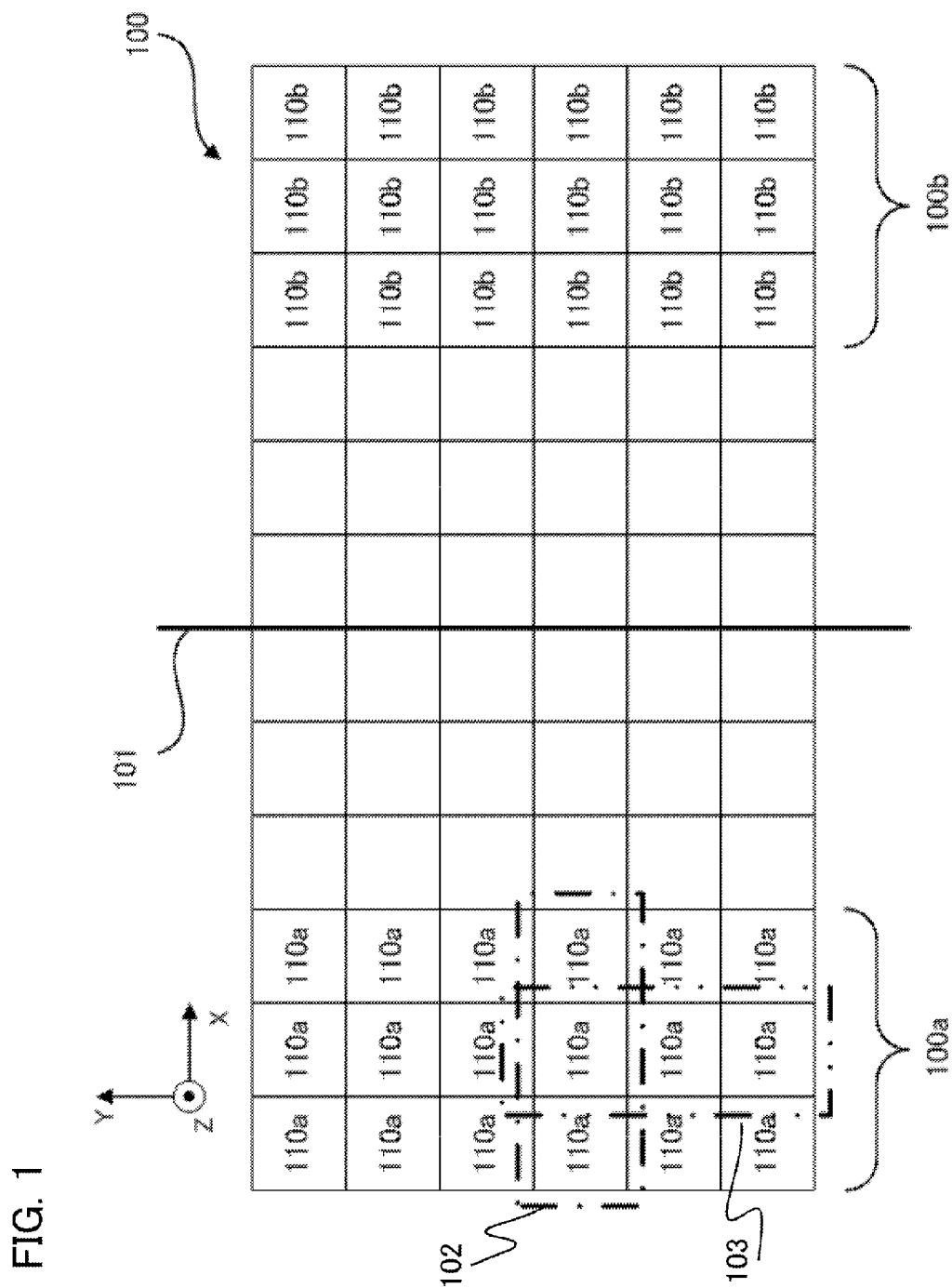
FIG. 1 is a diagram showing a solid-state image sensor relating to the first embodiment.

Below, a ranging device according to an embodiment of the present invention will be described. Here, elements which have the same function are labelled with the same reference numerals in all of the drawings, and repeated description is omitted.

First Embodiment

<In-Plane Arrangement>

FIG. 1 is a diagram showing an arrangement of the ranging pixels in a solid-state image sensor 100 according to the present embodiment. First ranging pixels 110a are ranging pixels which are arranged in a peripheral region 100a in a −X direction (first region) in the solid-state image sensor 100. The peripheral region 100a is a region which is distanced by at least a prescribed distance in the −X direction from a straight line 101 extending in a direction which is perpendicular to the X direction (namely, in the Y direction) and which passes through the center of the solid-state image sensor 100. On the other hand, second ranging pixels 110b are ranging pixels which are arranged in a peripheral region 100b in a +X direction (second region) in the solid-state image sensor 100. The peripheral region 100b is a region which is distanced by at least a prescribed distance in the +X direction from a straight line 101 extending in a direction which is perpendicular to the X direction (namely, in the Y direction) and which passes through the center of the solid-state image sensor 100. The square shapes not labelled with the reference numerals 110a and 110b may be ranging pixels or may be normal imaging pixels. The ranging pixels and the imaging pixels are described below. The prescribed distance is desirably not less than 0.25 times, and more desirably, not less than 0.40 times, the X-direction length of the solid-state image sensor 100. The reason for this is as follows.

<Photoelectric Conversion Units and Barrier Region>

Figure 2A:
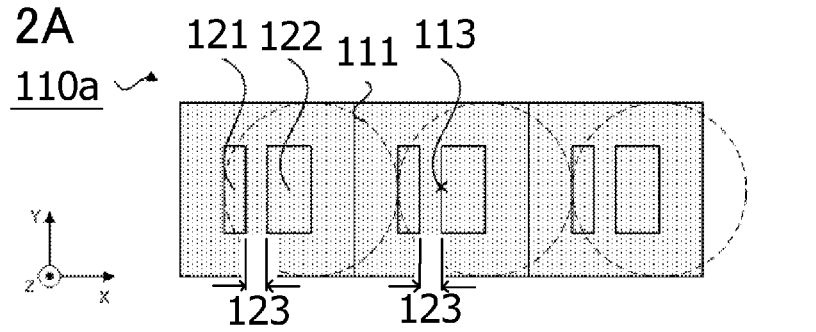
FIGS. 2A to 2C are diagrams showing ranging pixels relating to the first embodiment.
Figure 2B:
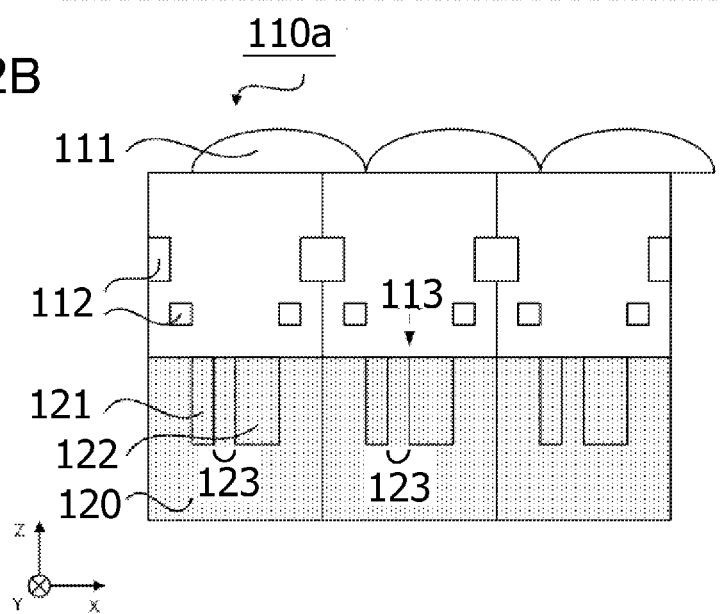

FIG. 2 is a diagram showing a composition of three ranging pixels 110a which are arranged in a peripheral region 100a (first region) of the solid-state image sensor surrounded by the single-dotted line 102 in FIG. 1. FIG. 2B is a schematic diagram in the XZ cross-section of three ranging pixels 110a. The ranging pixels 110a each have, from the side where the light is incident, a microlens 111, photoelectric conversion units 121, 122 formed inside the substrate 120, and a barrier region 123 arranged between the photoelectric conversion units 121, 122. FIG. 2A is a planar schematic drawing of three ranging pixels 110a in the XY plane in FIG. 1. The first photoelectric conversion unit 121, the barrier region 123 and the second photoelectric conversion unit 122 are arranged in this sequence in the +X direction (the positive direction of the first direction).

As shown in FIGS. 2A and 2B, the center of the barrier region 123 of the ranging pixel 110a is situated eccentrically (off-centered) in the −X direction (the negative direction of the first direction) with respect to a pixel center 113 of the ranging pixel 110a. Here, the pixel center is the center of gravity of the region including the XY cross-section of the photoelectric conversion unit, which is surrounded by the projected portion of a wire 112 surrounding the pixel, when the wire 112 is projected to an XY cross-section on the surface of the substrate.

Figure 2C:
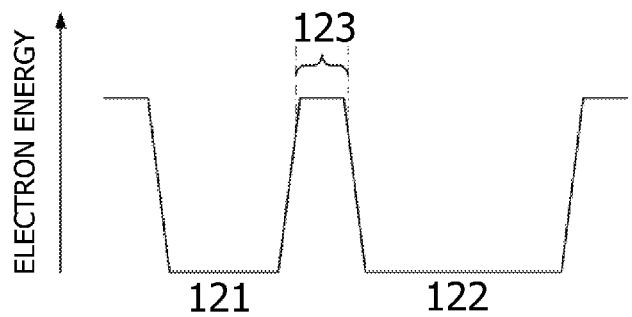

The photoelectric conversion units 121 and 122 are created by forming a potential distribution by ion doping in the substrate 120 which is made from a material, such as silicon, having absorptivity in the detected wavelength band. A potential barrier is formed between the photoelectric conversion units 121 and 122, to create a barrier region 123. The barrier region 123 indicates a region including the maximum value of the potential barrier formed between the photoelectric conversion units 121 and 122 (FIG. 2C). More specifically, it is a region having a potential barrier size of equal to or more than 90% of the maximum value of the potential barrier.

The size of the potential barrier in the barrier region 123 may be determined by the amount of electric charge cross-talk tolerated between the photoelectric conversion units 121 and 122. The greater the potential barrier, the greater the extent to which the amount of electric charge cross-talk can be suppressed. Conversely, the smaller the potential barrier, the greater the effective size of the photoelectric conversion region, and the further the extent to which the sensitivity of the ranging pixel can be improved. It is also possible to form a potential barrier by ion doping in the region corresponding to the barrier region 123, rather than the regions corresponding to the photoelectric conversion units 121 and 122. Furthermore, it is also possible to perform ion doping in both regions. In this case, desirably, ions having conductivity that is the reverse of the ions doped into the region corresponding to the photoelectric conversion units are doped into the barrier region.

<Micro-Lenses>

The microlenses 111 respectively conduct the light beam in different regions of the exit pupil (not illustrated) of the imaging optical system to the photoelectric conversion units 121 and 122. The light beam incident on the respective photoelectric conversion units is converted into an electrical signal, and is sent to a signal processing unit (not illustrated) by wiring 112 which is arranged so as to surround the ranging pixel. It is possible to calculate the depth to the object by the principle of triangulation, by determining the amount of positional displacement between the object image which is acquired from the electrical signal converted by the photoelectric conversion unit 121 and the object image which is acquired from the electrical signal converted by the photoelectric conversion unit 122.

As shown in FIGS. 2A and 2B, the light axis of the microlens 111 of each ranging pixel 110a is situated eccentrically in the +X direction (the positive direction of the first direction) with respect to the pixel center 113 of the ranging pixel 110a. The microlens 111 is situated eccentrically in the ranging pixels 110a of the peripheral region 100a of the solid-state image sensor 100 for the same reason as in Japanese Patent Application Publication No. 2010-182765.

The microlens 111 is made from silicon oxide or an organic material, or the like, which is transparent in the detected wavelength region, and is arranged so as to span the photoelectric conversion units 121 and 122. The ranging pixels and the microlenses 111 correspond to each other in a one-to-one relationship. When this condition is met, a portion of the microlens 111 may be arranged on top of an adjacent pixel.

<Second Region on Opposite Side, and Summary of Arrangement>

Figure 3A:
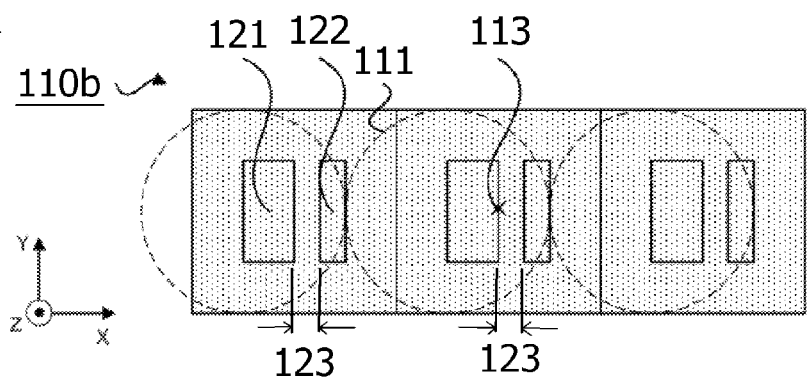
FIGS. 3A and 3B are diagrams showing ranging pixels relating to the first embodiment.
Figure 3B:
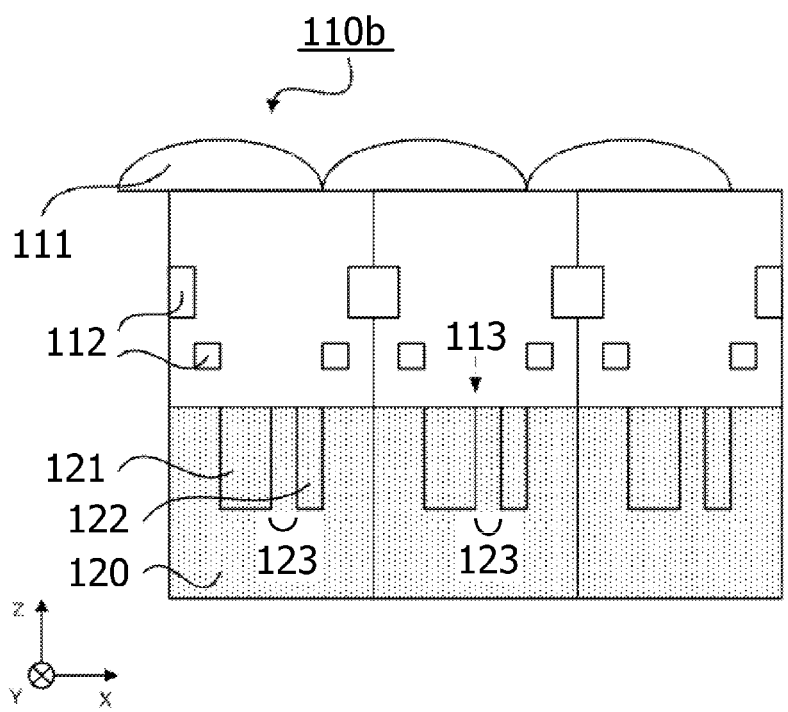

As shown in FIG. 3, in the ranging pixels 110b arranged in the peripheral region in the +X direction (second region), the center of the barrier region 123 is situated eccentrically in the +X direction (the positive direction of the first direction) with respect to the pixel center 113. Similarly, the light axis of the microlens 111 is arranged eccentrically in the −X direction (the negative direction of the first direction) with respect to the pixel center 113.

In other words, in the peripheral region 100a in the −X direction (the negative direction of the first direction) from the straight line 101 passing through the center of the solid-state image sensor, the center of the barrier region 123 is situated eccentrically in the −X direction (the negative direction of the first direction) with respect to the pixel center. On the other hand, in the peripheral region 100b in the +X direction (the positive direction of the first direction) from the straight line 101 passing through the center of the solid-state image sensor, the center of the barrier region 123 is situated eccentrically in the +X direction (the positive direction of the first direction) with respect to the pixel center.

By composing the ranging pixels 110a and 110b in this way, in the peripheral regions 100a and 100b of the solid-state image sensor 100, it is possible to achieve highly accurate depth measurement (ranging), regardless of the lens used, or the zoom and focus conditions. Below, the reasons for this are explained by comparison with a prior art example in which the center of the barrier region coincides with the pixel center. For the purpose of simplification, only the ranging pixels arranged in the peripheral region in the −X direction are described here, but a similar explanation obviously applies to the ranging pixels arranged in the peripheral region in the +X direction also.

<Description of Prior Art Example and Problems>

Figure 11A:
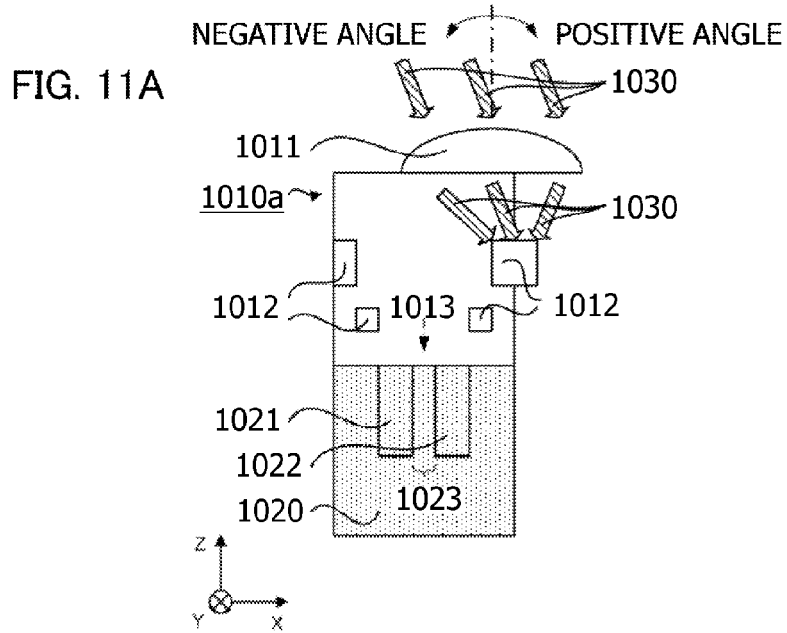
FIGS. 11A to 11C are diagrams showing ranging pixels according to a comparative example.

FIG. 11A shows a schematic drawing of a ranging pixel 1010a which is arranged in a peripheral direction in the −X direction in a solid-state image sensor 1000 according to a comparative example. The ranging pixel 1010a includes, from the side where the light is incident, a microlens 1011, a plurality of photoelectric conversion units 1021, 1022, and a barrier region 1023 arranged between the plurality of photoelectric conversion units. The central axis of the microlens 1011 is situated eccentrically in the +X direction with respect to a pixel center 1013 of the ranging pixel 1010a. However, in contrast to the ranging pixel 110a described above, the center of the barrier region 1023 coincides with the pixel center 1013. The arrow in FIG. 11A indicates the mode of propagation of the light beam. This is described hereinafter.

Figure 11B:
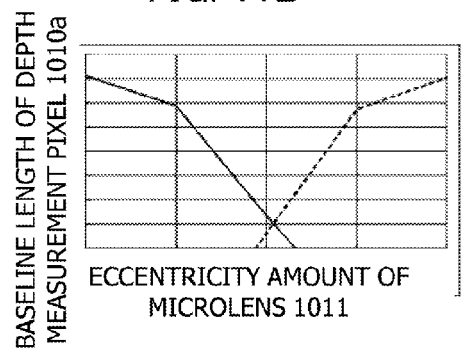

FIG. 11B is a diagram illustrating change in the baseline length when the amount of eccentricity of the microlens 1011 is changed in the ranging pixel 1010a. The baseline length is a value corresponding to the angular difference between the light beams received by the photoelectric conversion units 1021 and 1022, and the greater the baseline length, the higher the accuracy of depth measurement that can be achieved. The solid line in FIG. 11B is the baseline length when the exit pupil distance in the imaging optical system is far (for example, the telescopic side of a zoom lens), and the dotted line in FIG. 11B is the baseline length when the exit pupil of the imaging optical system is near (for example, the wide-angle side of a zoom lens). As is clear from FIG. 11B, when the amount of eccentricity of the microlens 1011 is small, the baseline length with a far exit pupil distance is large, but the baseline length with a near exit pupil distance is small. On the other hand, if the amount of eccentricity of the microlens 1011 is large, then the baseline length with a near exit pupil distance is large, but the baseline length with a far exit pupil distance is small. In this way, there is a trade-off between the depth measurement accuracy when the exit pupil is near and when the exit pupil is far.

Next, the reasons why this trade-off occurs will be explained. FIG. 11A shows a mode of propagation of a light beam when the exit pupil distance is far. When the amount of eccentricity of the microlens 1011 is large, a light beam 1030 which passes through a far-distance exit pupil and is incident on the ranging pixel at a negative angle of incidence is absorbed by a wiring 1012 which is arranged in a central direction (+X direction) of the solid-state image sensor with respect to the ranging pixel. Therefore, the angle of the center of gravity of the light beam received by the photoelectric conversion unit 1022 is displaced to the positive angle side. As a result of this, the difference between the angle of the center of gravity of the light beam received by the photoelectric conversion unit 1021 and the center of gravity of the light beam received by the photoelectric conversion unit 1022 becomes smaller, and the depth measurement accuracy declines. Here, with regard to the positive/negative direction of the angle of incidence of the light beam, as shown in FIG. 11A, the angle of the light beam incident with an inclination in the peripheral direction of the solid-state image sensor (−X direction) (the clockwise direction with respect to the −Z direction), is taken to be positive.

Figure 11C:
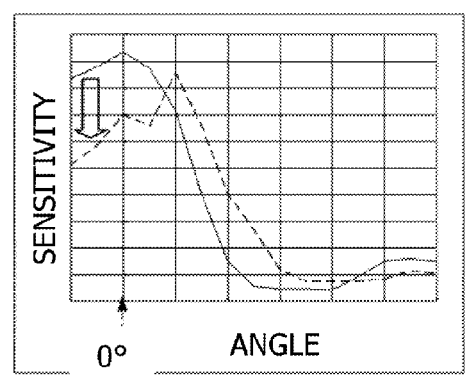

In actual practice, FIG. 11C shows the angular characteristics of the sensitivity of the photoelectric conversion unit 1022 in a ranging pixel 1011a, when the amount of eccentricity of the microlens 1011 is altered. The solid line in FIG. 11C shows a case where the amount of eccentricity of the microlens 1011 is small and the dotted line shows a case where the amount of eccentricity of the microlens 1011 is large. From FIG. 11C, it can be seen that if the amount of eccentricity of the microlens 1011 is large, then the sensitivity of the photoelectric conversion unit 1022 with respect to the light beam incident at a negative angle declines.

In this way, in the ranging pixel 1010a, if the amount of eccentricity of the microlens 1011 is raised in order to improve the depth measurement accuracy when the exit pupil distance is near, then a portion of the light beam which is incident when the exit pupil distance is far will be absorbed by the wiring inside the pixel. As a result of this, the difference between the angles of the center of gravity of the light beams received by the photoelectric conversion units 1021, 1022 becomes smaller, and the depth measurement accuracy with a far exit pupil distance declines. This is the principal reason why the trade-off occurs.

<Beneficial Effects of Applying the Present Invention>

On the other hand, in the ranging pixels 110a illustrated in the present invention, the center of the barrier region 123 is situated eccentrically in the −X direction (the negative direction of the first direction) with respect to the pixel center 113. By adopting a composition of this kind, it is possible to eliminate the trade-off. This is described below.

Figure 4A:
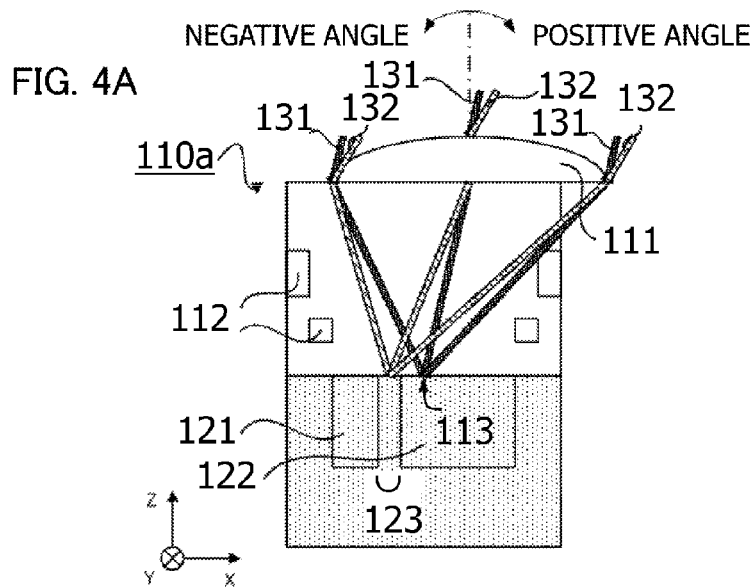
FIGS. 4A to 4C are diagrams illustrating the characteristics of a ranging pixel.

FIG. 4A shows a mode of propagation of a light beam 132 which is incident on the center of the barrier region 123 and a light beam 131 which is incident on the pixel center 113, in a ranging pixel 110a. As FIG. 4A reveals, the angle of incidence of the light beam 132 which is incident on the center of the barrier region 123 is inclined in a positive direction with respect to the angle of incidence of the light beam 131 which is incident on the pixel center 113. Therefore, by situating the center of the barrier region 123 eccentrically in the −X direction with respect to the pixel center, the sensitivity curve of the photoelectric conversion units 121, 122 is displaced to the positive angle side. As a result of this, the difference between the centers of gravity of the light beams received by the photoelectric conversion unit 121 and the photoelectric conversion unit 122 when the angle of the main incident light beam is large (when the exit pupil distance is near), becomes large, and therefore the depth measurement accuracy with a near exit pupil distance can be improved.

Figure 4B:
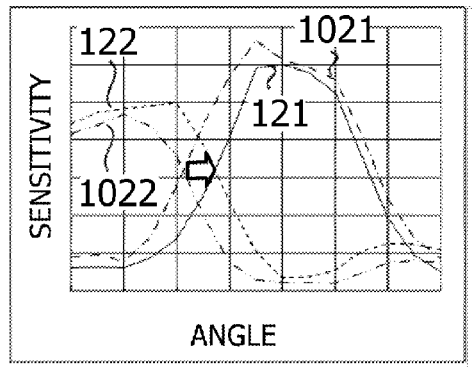

FIG. 4B show the actual angular characteristics of a ranging pixel 110a compared to the angular characteristics of a ranging pixel 1010a in which the center of the barrier region coincides with the pixel center. The solid line indicates the characteristics of the photoelectric conversion unit 121 in the ranging pixel 110a and the dotted line indicates the characteristics of the photoelectric conversion unit 122 in the ranging pixel 110a. Furthermore, the single-dotted line indicates the characteristics of the photoelectric conversion unit 1021 in the ranging pixel 1010a and the double-dotted line indicates the characteristics of the photoelectric conversion unit 1022 in the ranging pixel 1010a. From FIG. 4B, it can be seen that the sensitivity curve of the ranging pixel 110a is displaced in the positive direction of the ranging pixel 1010a. In this case, as can be seen from FIG. 4B, the sensitivity of the photoelectric conversion unit 122 with respect to the light beam which is incident at a negative angle (dotted line) is not reduced compared to the sensitivity of the photoelectric conversion unit 1022 (double-dotted line). Consequently, the depth measurement accuracy of the ranging pixel 110a with a far exit pupil distance is not reduced compared to the ranging pixel 1010a, and the depth measurement accuracy of the ranging pixel 110a with a near exit pupil distance can be improved compared to the ranging pixel 1010a.

Figure 4C:
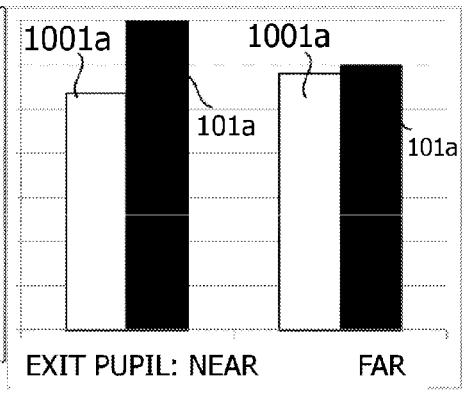

FIG. 4C shows the baseline length of the ranging pixel 110a and the ranging pixel 1010a in cases where the exit pupil distance is far and near. In FIG. 4C, the white bar graph shows a baseline length of the ranging pixel 1010a and the black bar graph shows a baseline length of the ranging pixel 110a. From FIG. 4C, it can be seen that, compared to the ranging pixel 1010a, the ranging pixel 110a shows virtually no decline in the depth measurement accuracy when the exit pupil distance is far, and can improve the depth measurement accuracy when the exit pupil distance is near.

As described above, in the ranging pixel 110a, the depth measurement accuracy when the exit pupil distance is near is improved, without any increase in the amount of eccentricity of the microlens, and therefore the trade-off which occurred with the ranging pixel 1010a can be eliminated. Therefore, depth measurement of high accuracy can be achieved, regardless of the camera lens and the zoom and focus conditions.

<Further Results>

Moreover, by adopting the composition of the present invention for the ranging pixel 110a, the ranging pixel when projecting an object of low brightness is also improved compared to a case where the conventional ranging pixel 1010a is used, which is more desirable. This is described below.

In a conventional ranging pixel 1010a, the depth measurement accuracy is improved when the exit pupil distance is near, by increasing the amount of eccentricity of the microlens, and therefore a portion of the light beam is absorbed by the wiring, as described above. As a result of this, the sensitivity of the photoelectric conversion unit 1022 which has relatively lower sensitivity, in particular, declines further, and the depth measurement accuracy with respect to an object of low brightness falls. On the other hand, in the conventional ranging pixel 110a according to the present invention, the depth measurement accuracy is improved when the exit pupil distance is near, without increasing the amount of eccentricity of the microlens, and hence there is little reflection or absorption of the light beam by the wiring. Consequently, the sensitivity of the photoelectric conversion unit 122 is greater than the photoelectric conversion unit 1022, and the depth measurement accuracy with respect to an object of low brightness can be improved. In actual practice, as shown in FIG. 4B, the sensitivity of the photoelectric conversion unit 122 is greater than the sensitivity of the photoelectric conversion unit 1022. In this case, the sensitivity of the photoelectric conversion unit 121 is slightly lower than the photoelectric conversion unit 1021, but since the original sensitivity is relatively higher than the photoelectric conversion unit 122, the effects on the depth measurement accuracy with respect to an object of low brightness are small. In other words, by adopting the composition of the present invention, the difference in sensitivity between the photoelectric conversion unit 121 and the photoelectric conversion unit 122 is reduced, and therefore the depth measurement accuracy when projecting an object of low brightness can be improved.

<Difference in Capacitance>

In the ranging pixels, it is more desirable if the photoelectric conversion unit 121 and the photoelectric conversion unit 122 have different capacities. More specifically, in the ranging pixels 110a, desirably, the capacitance of the photoelectric conversion unit 121 positioned in the −X direction is greater than the photoelectric conversion unit 122 positioned in the +X direction. On the other hand, in the ranging pixels 110b, desirably, the capacitance of the photoelectric conversion unit positioned in the +X direction is greater than the photoelectric conversion unit positioned in the −X direction. By adopting this composition, it is possible to improve the depth measurement accuracy when projecting an object of high contrast, in particular. The reasons for this are described below.

As can be seen from FIG. 4B, in the ranging pixels 110a, the maximum value of the sensitivity of the photoelectric conversion unit 121 is greater than the maximum value of the sensitivity of the photoelectric conversion unit 122. If the exposure time is determined in accordance with the sensitivity of the photoelectric conversion unit 121, then the amount of light at the photoelectric conversion unit 122 will be insufficient, and if the exposure time is determined in accordance with the sensitivity at the photoelectric conversion unit 122, then the photoelectric conversion unit 121 is liable to become saturated. Here, if the capacitance of the photoelectric conversion unit 121 is greater than the photoelectric conversion unit 122, then it is possible to resolve the saturation of the photoelectric conversion unit 121 and the insufficiency of the amount of light in the photoelectric conversion unit 122.

<Changing the Capacitance>

To make the capacitance of the photoelectric conversion unit larger, the capacitance of the photoelectric conversion unit may be made larger. More specifically, any one of the X-direction width, the Y-direction width, and the Z-direction depth of the photoelectric conversion unit may be made larger. Alternatively, it is also possible to increase the capacitance of the photoelectric conversion unit by raising the density of the impurity with which the photoelectric conversion unit is doped. In the ranging pixel 110a in the solid-state image sensor which uses the present invention, it is necessary to situate the center of the barrier region 123 between the photoelectric conversion units 121 and 122 eccentrically towards the side of the photoelectric conversion unit 121 with respect to the pixel center. Therefore, desirably, the capacitance is changed by altering the Z-direction depth or the density of impurity in the photoelectric conversion unit.

Figure 5A:
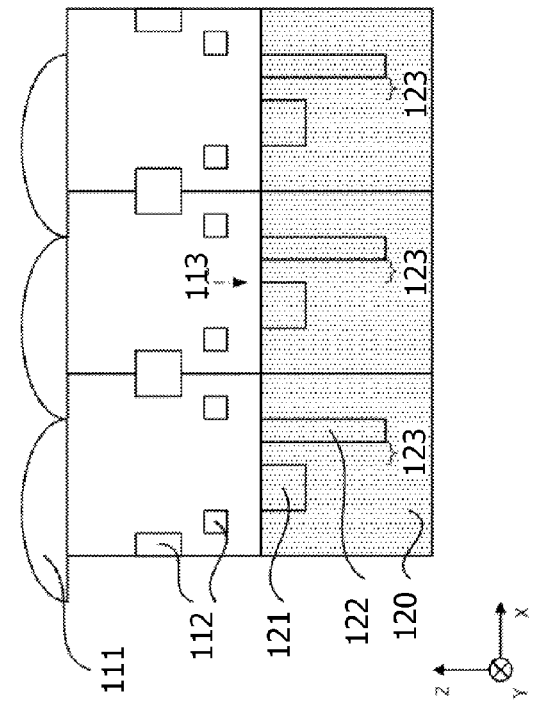
FIGS. 5A and 5B are diagrams showing modification examples of ranging pixels relating to the first embodiment.
Figure 5B:
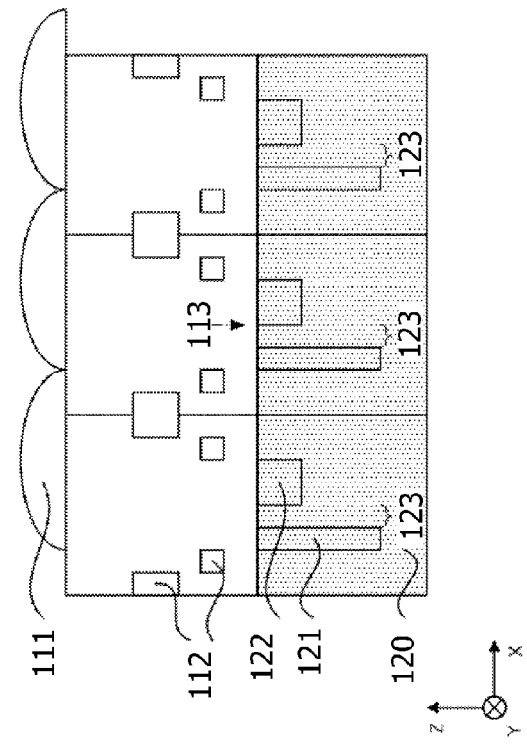

FIG. 5 shows one example of a case where the Z-direction depth of the photoelectric conversion unit is changed. FIG. 5A shows a ranging pixel 110a and FIG. 5B shows a ranging pixel 110b. As shown in FIG. 5A, in the ranging pixels 110a, the capacitance of the first photoelectric conversion unit 121 which is positioned in the −X direction is greater than the capacitance of the second photoelectric conversion unit 122 which is positioned in the +X direction. On the other hand, as shown in FIG. 5B, in the ranging pixels 110b, the capacitance of the second photoelectric conversion unit which is positioned in the +X direction is greater than the capacitance of the first photoelectric conversion unit which is positioned in the −X direction.

<Control of Drift Electric Field>

It is even more desirable if the magnitude of the drift electric field in the lateral direction in the photoelectric conversion units which have a relatively large capacitance is made greater than the magnitude of the drift electric field in the photoelectric conversion units which have a relatively small capacitance. The reason for this is that the transfer rate of the electric charge becomes slower, as the capacitance of the photoelectric conversion units becomes larger. By making the magnitude of the drift electric field in the photoelectric conversion units which have a relatively large capacitance greater than the magnitude of the drift electric field in the photoelectric conversion units which have a relatively small capacitance, it is possible to suppress differences in the transfer rate of the electrical charge. In order to increase the magnitude of the drift electric field, a gradient of the impurity distribution may be formed in the lateral direction, by carrying out a plurality of doping actions in a staggered fashion in the lateral direction.

More specifically, in the ranging pixels 110a, the magnitude of the drift electric field in the lateral direction in the first photoelectric conversion unit 121 which is positioned in the −X direction is greater than the magnitude of the drift electric field in the lateral direction of the second photoelectric conversion unit 122 which is positioned in the +X direction. On the other hand, in the ranging pixels 110b, the magnitude of the drift electric field in the lateral direction in the second photoelectric conversion unit which is positioned in the +X direction is greater than the magnitude of the drift electric field in the lateral direction of the first photoelectric conversion unit which is positioned in the −X direction.

<Definition of Peripheral Region>

The greater the distance of the ranging pixel from the straight line 101 passing through the center of the solid-state image sensor, the greater the dependence of the angle of incidence of the main light beam at the ranging pixel, on the exit pupil distance of the imaging optical system. In particular, in the region which is distanced by not less than 0.25 times the X-direction length of the solid-state image sensor from the straight line 101, the angle of incidence varies greatly. Moreover, in the region which is distanced by not less than 0.40 times the X-direction length of the solid-state image sensor from the straight line 101, the angle of incidence varies even more greatly. Therefore, the interval between the straight line 101 and the peripheral regions 100a, 100b (the prescribed distance) is desirably 0.25 times the X-direction length of the solid-state image sensor and more desirably not less than 0.40 times the X-direction length of the solid-state image sensor.

<Greater Eccentricity Towards Periphery>

Furthermore, desirably, the greater the distance of the ranging pixel from the straight line 101, the greater the amount of eccentricity of the center of the barrier region 123 with respect to the pixel center 113. By this composition, it is possible to achieve highly accurate depth measurement, even in cases where the lens or the zoom and focus conditions have changed, regardless of the position of the ranging pixel in the solid-state image sensor. Moreover, it is also possible to increase the amount of eccentricity of the microlens 111, the greater the distance of the ranging pixel from the straight line 101.

FIG. 6A shows one example. FIG. 6A depicts three ranging pixels 110a which are in the region of the single-dotted line 102 in FIG. 1. In FIG. 6A, the ranging pixels 110a are depicted separately. Furthermore, the sequence of the arrangement of the three ranging pixels 110a is the same as the sequence of the arrangement of the three ranging pixels 110a in the region of the single-dotted line 102 in FIG. 1. The ranging pixel 110a furthest in the −X direction is the ranging pixel 110a furthest from the straight line 101 of the three ranging pixels 110a, and the ranging pixel 110a furthest in the +X direction is the ranging pixel 110a nearest to the straight line 101 of the three ranging pixels 110a. In accordance with this, the further the position of the ranging pixel 110a towards the −X direction, the greater the amount of eccentricity of the barrier region 123 with respect to the pixel center 113. Similarly, the amount of eccentricity of the microlens 111 becomes greater, the further the position of the ranging pixel 110a in the −X direction.

<Eccentricity Also in the Central Region>

In the region in the vicinity of the center of the solid-state image sensor 100, in other words, the region less than a prescribed distance from the straight line 101 which is perpendicular to the X direction and passes through the center of the solid-state image sensor 100, the main light beam incident on the pixel is incident at an angle close to perpendicular at all times, irrespective of the exit pupil distance in the imaging optical system. More specifically, if the distance from the straight line 101 is less than 0.25 times the X-direction length of the solid-state image sensor, then the light is incident at an angle close to perpendicular. Therefore, in the vicinity of the center of the solid-state image sensor, the center of the barrier region 123 does not have to be situated eccentrically with respect to the pixel center 113.

However, in the region in the vicinity of the center of the solid-state image sensor 100, the main light beam incident on the pixel is incident at an inclination, even though the angle is close to perpendicular. Consequently, in a region which is less than a prescribed distance from the straight line 101 perpendicular to the X direction and passing through the center of the solid-state image sensor 100, the center of the barrier region 123 may be situated eccentrically with respect to the pixel center.

<Eccentricity of Microlens>

In FIG. 2 and FIG. 3, an example is shown in which in the ranging pixels the light axis of the microlens 111 is arranged eccentrically with respect to the pixel center 113, but the microlens 111 does not have to be arranged eccentrically. Even if the microlens 111 is not situated eccentrically, due to the center of the barrier region 123 being situated eccentrically with respect to the pixel center 113, the sensitivity curve is displaced to the positive angle side with respect to a case where the center of the barrier region and the pixel center coincide with each other. As a result of this, it is possible to improve the depth measurement accuracy in cases where the exit pupil distance is near. As shown in FIG. 2 and FIG. 3, the light axis of the microlens 111 is desirably situated eccentrically in the central direction of the solid-state image sensor with respect to the pixel center 113, since this improves the depth measurement accuracy when the exit pupil distance is near.

Moreover, it is also possible for the light axis of the microlens 111 to be situated eccentrically in an oblique direction with respect to the pixel center 113. The light beam which is incident on the pixels situated in the peripheral regions 100a, 100b of the solid-state image sensor 100 is inclined with respect to the center of the solid-state image sensor 100, and therefore, it is desirable for the light axis of the microlens 111 to be situated eccentrically in an oblique direction towards the center of the solid-state image sensor 100, since this enables the light beam to be input efficiently. FIG. 6B shows one example of this composition. FIG. 6B depicts three ranging pixels which are in the region of the double-dotted line 103 in FIG. 1. In FIG. 6B, the ranging pixels 110a are depicted separately. In this way, the direction of eccentricity of the microlenses 111 of the ranging pixels 110a can be changed in accordance with the arrangement position of the ranging pixel.

<Tolerance of Pixels not Meeting Conditions>

It is not necessary for the center of the barrier region to be situated eccentrically with respect to the pixel center in all of the ranging pixels 110a, 110b arranged in the peripheral regions 100a, 100b of the solid-state image sensor, and the center of the barrier region may be situated eccentrically with respect to the pixel center in a portion of the pixels. However, in order to carry out highly accurate depth measurement regardless of the exit pupil distance, it is necessary for the center of the barrier region to be eccentric in the peripheral direction of the solid-state image sensor with respect to the pixel center, in at least more than half of the ranging pixels. The higher the ratio of the ranging pixels which satisfy the above-mentioned conditions, the higher the accuracy of the depth measurement which can be achieved, and therefore the more desirable. For instance, more desirably, not less than 80% of the ranging pixels satisfy the above-mentioned conditions.

<Ranging Pixels, Imaging Pixels and Merits in Captured Image>

All of the pixels of the solid-state image sensor 100 may be ranging pixels, or only a portion thereof may be ranging pixels, and the remainder may be normal imaging pixels. If all of the pixels are ranging pixels, then it is possible to acquire a captured image by taking the sum of the electrical signals acquired by the plurality of photoelectric conversion units. The imaging pixels are images having a single photoelectric conversion unit and a microlens which is arranged on top of the single photoelectric conversion unit.

If a portion of the pixels of the solid-state image sensor 100 are ranging pixels, then the captured image in the ranging pixels may be acquired by the method described above, or may be acquired by complementing with captured images acquired by normal imaging pixels provided about the periphery of the ranging pixel. In the imaging pixels positioned in the peripheral regions 100a, 100b, it is desirable in order to improve the quality of the captured image for the microlenses to be situated eccentrically in the central direction of the solid-state image sensor.

As described above, by adopting the ranging pixels 110a, 110b for the composition according to the present invention, the sensitivity difference between the photoelectric conversion units is reduced compared to a case where conventional ranging pixels are used. Therefore, if a ranging pixel image is acquired by summing the electrical signals of a plurality of photoelectric conversion units in the ranging pixels, this is more desirable in terms of improving the quality of the captured image than a case where a conventional ranging pixel is used.

<Waveguide>

Figure 7:
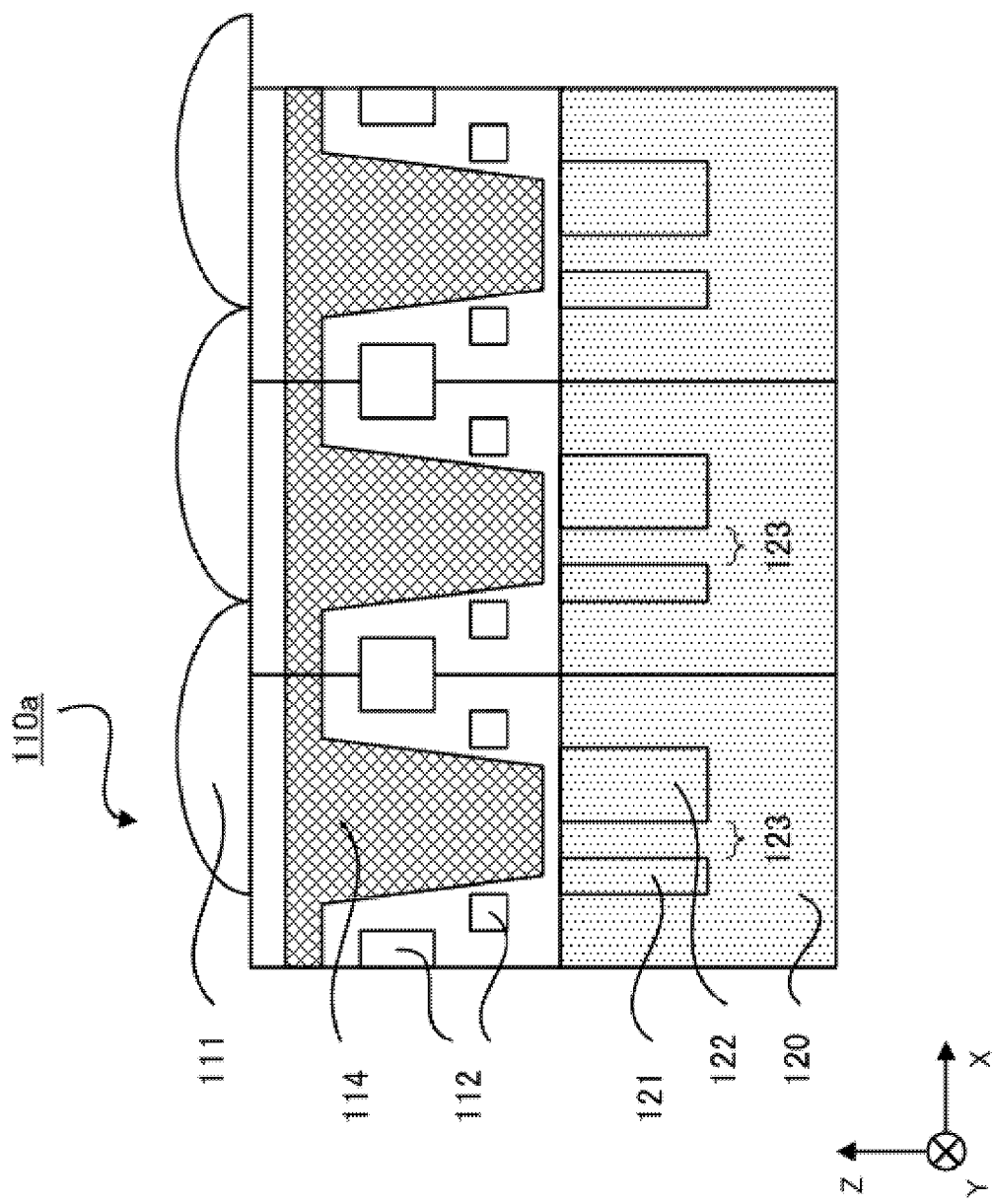
FIG. 7 is a diagram showing a modification example of a solid-state image sensor relating to the first embodiment.

It is also possible to provide a color filter between the microlens 111 and the substrate 120, so as to be able to acquire color information. Furthermore, as shown in FIG. 7, a waveguide 114 for guiding the light beam efficiently to the photoelectric conversion units 121, 122 may be provided between the microlens 111 and the substrate 120. In this case, the waveguide 114 is desirably provided so as to span the photoelectric conversion units 121 and 122.

<Wiring on Incident Side of Light>

Furthermore, the description given above related to a front surface irradiation type of configuration having wiring on the side where the light is incident with respect to the photoelectric conversion units, but the present invention can also be applied to a rear surface irradiation type of solid-state image sensor having wiring on the opposite side to the side where the light is incident. In a rare surface irradiation type of solid-state image sensor, if the depth measurement accuracy is improved when the exit pupil distance is near by increasing the amount of eccentricity of the microlens, then a portion of the light beam is absorbed by the light shielding portion in order to prevent cross-talk with the adjacent pixels. By applying the present invention, since the amount of absorptivity of the light beam in the light shielding portion is reduced, then it is possible to achieve highly accurate depth measurement, irrespective of the exit pupil distance.

In general, since the wiring is larger than the light shielding portion, then the amount of absorption of the light beam when the amount of eccentricity of the microlens is increased is large. Therefore, the beneficial effects of the present invention become greater when applied to a front surface irradiation type of solid-state image sensor which has wiring on the side where the light is incident, with respect to the photoelectric conversion units.

Second Embodiment

Figure 8:
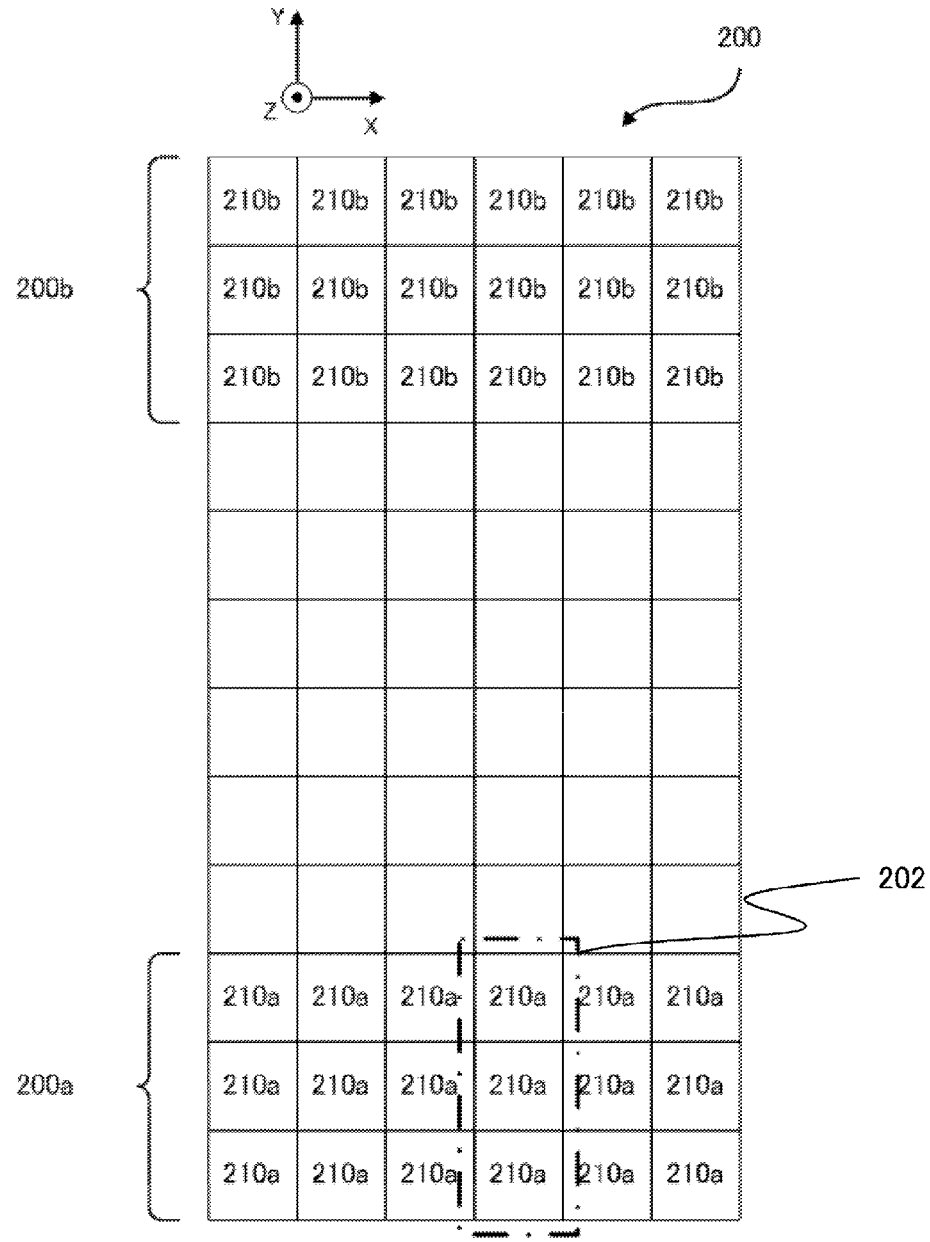
FIG. 8 is a diagram showing a solid-state image sensor relating to the second embodiment.

In the ranging pixels in the solid-state image sensor illustrated in the first embodiment, the direction in which the first photoelectric conversion units and the second photoelectric conversion units are aligned is the X direction. In other words, the solid-state image sensor described carries out depth measurement by acquiring light beams incident on the ranging pixels, in a divided fashion in the X direction. However, the present invention can also be applied to a solid-state image sensor having ranging pixels in which the direction of incidence is divided in a direction other than the X direction. FIG. 8 shows one portion of a solid-state image sensor 200 according to the present embodiment.

In this solid-state image sensor 200, a ranging pixels 210 which perform depth measurement are arranged in such a manner that the incident light beams are divided in the Y direction. The ranging pixels 210a are arranged in the peripheral region 200a in the −Y direction of the solid-state image sensor 200. Furthermore, the ranging pixels 210b are arranged in the peripheral region 200b in the +Y direction of the solid-state image sensor 200.

Figure 9A:
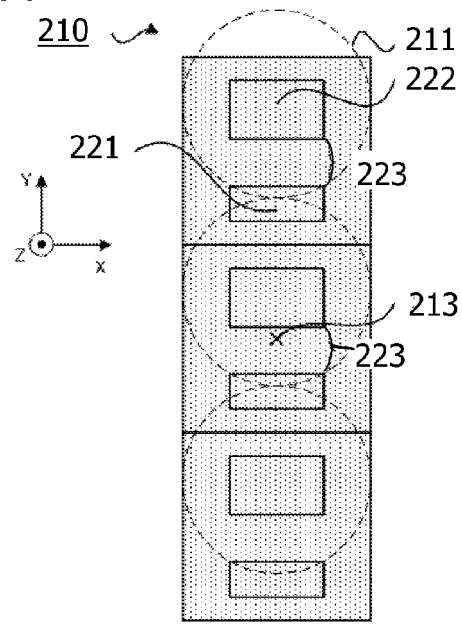
FIGS. 9A and 9B are diagrams showing ranging pixels relating to the second embodiment.
Figure 9B:
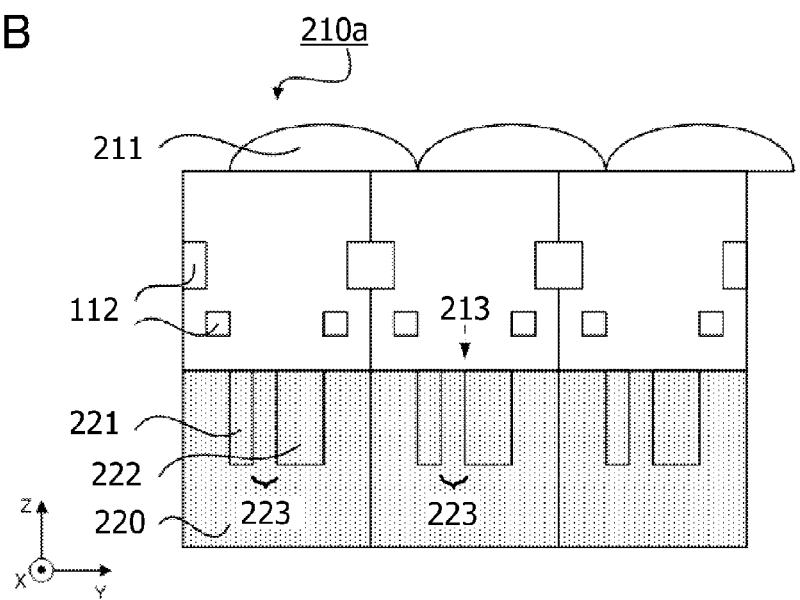

FIG. 9 is a diagram showing a composition of three ranging pixels 210a surrounded by the single-dotted line 202 in FIG. 8. FIG. 9B is a schematic diagram in the YZ cross-section of three ranging pixels 210a. The ranging pixels 210a include, from the side where the light is incident, a microlens 211, a first photoelectric conversion unit 221 arranged in order along the +Y direction (the positive direction of the first direction) formed in the substrate 120, a barrier region 223 and a second photoelectric conversion unit 222. FIG. 9A is a planar schematic diagram in the XY direction of three ranging pixels 210.

The light axis of the microlens 211 of each ranging pixel 210a is situated eccentrically in the +Y direction (the positive direction of the first direction) with respect to a pixel center 213 of the ranging pixel 210a. The center of the barrier region 223 of each ranging pixel 210a is situated eccentrically in the −Y direction (the negative direction of the first direction) with respect to the pixel center 213 of the ranging pixel 210a. According to this composition, similarly to the first embodiment, it is possible to improve the depth measurement accuracy when the exit pupil distance is near, without increasing the amount of eccentricity of the microlens. As a result of this, depth measurement of high accuracy can be achieved, regardless of the camera lens and the zoom and focus conditions.

The solid-state image sensor may be composed so as to include both ranging pixels in which the incident light beams are divided in the X direction and ranging pixels in which the incident light beams are divided in the Y direction. By adopting a configuration of this kind, it is possible to carry out depth measurement, regardless of the direction of the contrast in the object. In this case, the direction of eccentricity of the barrier region and the amount of eccentricity may be specified by the direction in which the incident light beams are divided and the position among the ranging pixels of the solid-state image sensor.

The various specific configurations described in the first embodiment can be adopted for the ranging pixels in which the direction of incidence is divided in a direction other than the X direction. Since the composition evidently changes with change in the direction of division, detailed description thereof is omitted here.

Third Embodiment

Figure 10:
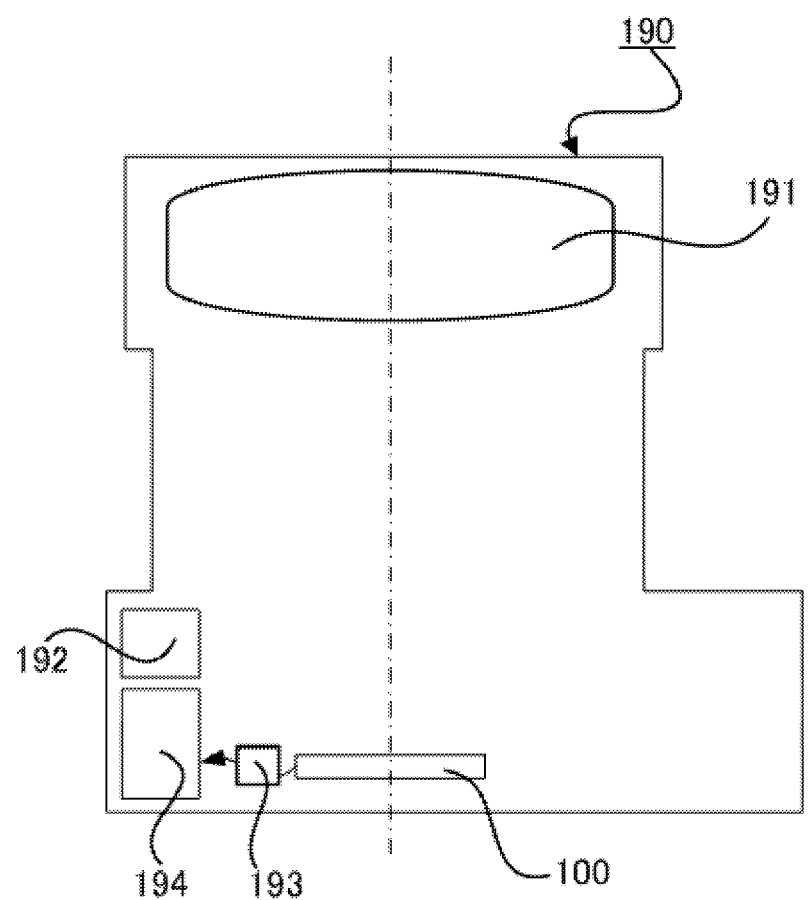
FIG. 10 is a diagram showing an imaging apparatus relating to the third embodiment.

FIG. 10 is a schematic drawing of an imaging apparatus 190, such as a digital still camera or digital video camera, provided with a solid-state image sensor 100 shown in the first embodiment. The imaging apparatus 190 includes, in addition to the solid-state image sensor 100, an imaging optical system 191, a CPU 192, a transfer circuit 193, and a signal processing unit 194, which are arranged from the side where the light is incident in the solid-state image sensor. The CPU 192 controls the operation of the transfer circuit 193 and the signal processing unit 194. The signals acquired by the photoelectric conversion units 121 and 122 are transferred to the signal processing unit 194 by the transfer circuit 193, depth measurement images are formed by the signal processing unit 194, and depth measurement is carried out by comparing the depth measurement images in the signal processing unit 194. Furthermore, the signals acquired by the photoelectric conversion units 121, 122 are similarly processed by the signal processing unit 194, and are also used as signals for a captured image.

The imaging apparatus 190 may be composed to include the solid-state image sensor 200 shown in the second embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-145559, filed on Jul. 11, 2013, Japanese Patent Application No. 2013-183017, filed on Sep. 4, 2013, Japanese Patent Application No. 2014-97073, filed on May 8, 2014, and Japanese Patent Application No. 2014-97074, filed on May 8, 2014, which are hereby incorporated by reference herein in their entirety.

What is claimed is:

1. A solid-state image sensor provided with a plurality of pixels which photo-electrically convert an object image formed by an imaging optical system,
    wherein at least a portion of the plurality of pixels are pixels for ranging in which a first photoelectric conversion unit, a barrier region and a second photoelectric conversion unit are provided in alignment in a first direction in this sequence;
    wherein when the region of the solid-state image sensor is divided by a straight line perpendicular to the first direction and passing through the center of the solid-state image sensor, into a first region which is positioned in a negative direction of the first direction from the straight line, and a second region which is positioned in a positive direction of the first direction from the straight line:
        more than half of the pixels for ranging in a portion of the first region which is distanced by at least a prescribed distance from the straight are first pixels in which the center of a barrier region is situated eccentrically in the negative direction of the first direction with respect to the center of the pixel, and
        more than half of the pixels for ranging in a portion of the second region which is distanced by at least the prescribed distance from the straight line are second pixels in which the center of a barrier region is situated eccentrically in the positive direction of the first direction with respect to the center of the pixel; and
    wherein a center of a pixel for ranging is a center of gravity of a region defined by the first photoelectric conversion unit and the second photoelectric conversion unit.

2. The solid-state image sensor according to claim 1, wherein more than half of the pixels for ranging in the first region are first pixels, and more than half of the pixels for ranging in the second region are second pixels.

3. The solid-state image sensor according to claim 2, wherein,
    in more than half of the pixels for ranging in a region of the first region which is less than the predetermined distance from the straight line, the center of the barrier region coincides with the center of the pixel; and
    in more than half of the pixels for ranging in a region of the second region which is less than the predetermined distance from the straight line, the center of the barrier region coincides with the center of the pixel.

4. The solid-state image sensor according to claim 2, wherein the predetermined distance is not less than 0.25 times the length of the solid-state image sensor in the first direction.

5. The solid-state image sensor according to claim 2, wherein the predetermined distance is not less than 0.40 times the length of the solid-state image sensor in the first direction.

6. The solid-state image sensor according to claim 1, wherein an amount of eccentricity of the center of the barrier region with respect to the pixel center becomes larger as the distance of the pixel from the straight line gradually increases.

7. The solid-state image sensor according to claim 1, wherein
    the pixels for ranging have a microlens;
    a light axis of the microlens in the first pixels in the first region is situated eccentrically in the positive direction of the first direction with respect to the pixel center; and
    a light axis of the microlens in the second pixels in the second region is situated eccentrically in the negative direction of the first direction with respect to the pixel center.

8. The solid-state image sensor according to claim 1, wherein
    in the first pixels in the first region, the capacitance of the first photoelectric conversion unit is greater than the capacitance of the second photoelectric conversion unit; and
    in the second pixels in the second region, the capacitance of the second photoelectric conversion unit is greater than the capacitance of the first photoelectric conversion unit.

9. The solid-state image sensor according to claim 8, wherein there is a difference in the capacities of the first and second photoelectric conversion units, due to the depth of the photoelectric conversion unit being different between the first and second photoelectric conversion units.

10. The solid-state image sensor according to claim 8, wherein there is a difference in the capacities of the first and second photoelectric conversion units due to the first and second photoelectric conversion units having different impurity densities therein.

11. The solid-state image sensor according to claim 8, wherein in the first pixels in the first region, a magnitude of a drift electric field in the first photoelectric conversion unit is greater than a magnitude of a drift electric field in the second photoelectric conversion unit; and in the second pixels in the second region, a magnitude of a drift electric field in the second photoelectric conversion unit is greater than a magnitude of a drift electric field in the first photoelectric conversion unit.

12. The solid-state image sensor according to claim 1, wherein the pixels for ranging have a waveguide spanning the first photoelectric conversion unit and the second photoelectric conversion unit.

13. The solid-state image sensor according to claim 1, wherein the pixels for ranging have a wiring at a position further toward a side where the light is incident than the first photoelectric conversion unit and the second photoelectric conversion unit.

14. An imaging apparatus, comprising:
the solid-state image sensor according to claim 1; and
an imaging optical system arranged on the side where the light is incident with respect to the solid-state image sensor.

15. The solid-state image sensor according to claim 1, wherein the center of the pixel for ranging is a center of gravity of a region surrounded by a portion that a wire is projected.

* * * * *